(12) United States Patent
Yang et al.

(10) Patent No.: US 8,367,798 B2
(45) Date of Patent: Feb. 5, 2013

(54) ACTIVE MATERIALS FOR PHOTOELECTRIC DEVICES AND DEVICES THAT USE THE MATERIALS

(75) Inventors: Yang Yang, Los Angeles, CA (US); Jianhui Hou, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/240,334

(22) Filed: Sep. 29, 2008

(65) Prior Publication Data

US 2010/0078074 A1   Apr. 1, 2010

(51) Int. Cl.
*C08G 75/00* (2006.01)

(52) U.S. Cl. ........ 528/380; 528/377; 528/370; 136/263; 257/40

(58) Field of Classification Search .................. 528/380; 136/263; 257/4
See application file for complete search history.

(56) References Cited

U.S. PATENT DOCUMENTS

| | | |
|---|---|---|
| 3,589,946 A | 6/1971 | Tarneja et al. |
| 4,060,426 A | 11/1977 | Zinchuk |
| 4,104,084 A | 8/1978 | Evans, Jr. |
| 4,252,573 A | 2/1981 | Boer et al. |
| 4,400,868 A | 8/1983 | Antypas et al. |
| 4,528,082 A | 7/1985 | Moustakas et al. |
| 4,543,443 A | 9/1985 | Moeller et al. |
| 4,574,160 A | 3/1986 | Cull et al. |
| 4,586,988 A | 5/1986 | Nath et al. |
| 4,590,327 A | 5/1986 | Nath et al. |
| 4,595,790 A | 6/1986 | Basol |
| 4,647,711 A | 3/1987 | Basol et al. |
| 4,663,495 A | 5/1987 | Berman et al. |
| 4,675,468 A | 6/1987 | Basol et al. |

(Continued)

FOREIGN PATENT DOCUMENTS

| | | |
|---|---|---|
| EP | 0949850 | 10/1999 |
| EP | 1916250 A1 | 4/2008 |

(Continued)

OTHER PUBLICATIONS

Shirashi et al. (Synthetic metals, 130, 139-147, 2002).*

(Continued)

*Primary Examiner* — Shane Fang
(74) *Attorney, Agent, or Firm* — Venable LLP; Henry J. Daley (57) ABSTRACT

A conjugated polymer has a repeated unit having the structure of formula (I)

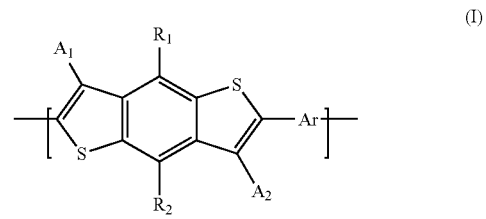

(I)

wherein A1, A2, R1 and R2 are independently selected from the group consisting of a proton, an alkyl group comprising up to 18 carbon atoms, an alkoxy group comprising up to 18 carbon atoms, cyano, nitro, aryls and substituted aryls, and wherein Ar is selected from the group consisting of ethenylene, ethynylene, monocyclic arylene, bicyclic arylene, polycyclic arylene, monocyclic heteroarylene, bicyclic heteroarylene, polycyclic heteroarylene, and one to five such groups one of fused or linked.

20 Claims, 4 Drawing Sheets

U.S. PATENT DOCUMENTS

| | | |
|---|---|---|
| 4,680,422 A | 7/1987 | Stanbery |
| 4,686,323 A | 8/1987 | Biter et al. |
| 4,695,674 A | 9/1987 | Bar-on |
| 4,808,242 A | 2/1989 | Murata et al. |
| 4,865,999 A | 9/1989 | Xi et al. |
| 5,069,727 A | 12/1991 | Kouzuma et al. |
| 5,133,810 A | 7/1992 | Morizane et al. |
| 5,176,758 A | 1/1993 | Nath et al. |
| 5,181,968 A | 1/1993 | Nath et al. |
| 5,288,338 A | 2/1994 | Morikawa |
| 5,298,086 A | 3/1994 | Guha et al. |
| 5,331,183 A * | 7/1994 | Sariciftci et al. ............ 257/40 |
| 5,458,694 A | 10/1995 | Nuyen |
| 5,479,043 A | 12/1995 | Nuyen |
| 5,723,873 A | 3/1998 | Yang |
| 5,797,998 A | 8/1998 | Wenham et al. |
| 5,942,048 A | 8/1999 | Fujisaki et al. |
| 6,121,542 A | 9/2000 | Shiotsuka et al. |
| 6,278,055 B1 | 8/2001 | Forrest et al. |
| 6,297,495 B1 | 10/2001 | Bulovic et al. |
| 6,320,117 B1 | 11/2001 | Campbell et al. |
| 6,325,777 B1 | 12/2001 | Zadno-Azizi et al. |
| 6,420,031 B1 | 7/2002 | Parthasarathy et al. |
| 6,469,437 B1 | 10/2002 | Parthasarathy et al. |
| 6,509,204 B2 | 1/2003 | Campbell |
| 6,515,030 B1 | 2/2003 | Bechtel |
| 6,538,194 B1 | 3/2003 | Koyanagi et al. |
| 6,657,378 B2 | 12/2003 | Forrest et al. |
| 6,913,943 B2 | 7/2005 | Cunningham et al. |
| 6,936,761 B2 | 8/2005 | Pichler |
| 7,022,910 B2 | 4/2006 | Gaudiana et al. |
| 7,105,237 B2 | 9/2006 | Sotzing |
| 7,163,831 B2 | 1/2007 | Hasegawa et al. |
| 7,183,418 B2 | 2/2007 | Heeney et al. |
| 7,332,223 B2 | 2/2008 | Sotzing et al. |
| 7,737,356 B2 | 6/2010 | Goldstein |
| 2002/0009015 A1 | 1/2002 | Laugharn |
| 2004/0099307 A1 | 5/2004 | Sun |
| 2004/0113546 A1 | 6/2004 | Forrest et al. |
| 2004/0265623 A1 | 12/2004 | Stegamat et al. |
| 2005/0074629 A1 | 4/2005 | Forrest et al. |
| 2005/0082525 A1* | 4/2005 | Heeney et al. ............ 257/40 |
| 2005/0126629 A1 | 6/2005 | Okada et al. |
| 2005/0150543 A1 | 7/2005 | Nakashima et al. |
| 2005/0164019 A1 | 7/2005 | Liu et al. |
| 2005/0205127 A1 | 9/2005 | Watanabe et al. |
| 2005/0209419 A1 | 9/2005 | Zahn et al. |
| 2005/0260777 A1 | 11/2005 | Brabec et al. |
| 2005/0268962 A1 | 12/2005 | Gaudiana et al. |
| 2005/0275340 A1 | 12/2005 | Choi et al. |
| 2006/0000506 A1 | 1/2006 | Brabec et al. |
| 2006/0065301 A1 | 3/2006 | Miyoshi |
| 2006/0071200 A1 | 4/2006 | Nordquist et al. |
| 2006/0090791 A1 | 5/2006 | Gaudiana et al. |
| 2006/0141662 A1 | 6/2006 | Brabec et al. |
| 2006/0234065 A1 | 10/2006 | Ohno et al. |
| 2006/0292736 A1 | 12/2006 | Lee et al. |
| 2007/0000537 A1 | 1/2007 | Leidholm et al. |
| 2007/0028959 A1 | 2/2007 | Lee et al. |
| 2007/0044836 A1 | 3/2007 | Forrest et al. |
| 2007/0068569 A1 | 3/2007 | Nam et al. |
| 2007/0079869 A1 | 4/2007 | Yukinobu |
| 2007/0095389 A1 | 5/2007 | Cho et al. |
| 2007/0095391 A1 | 5/2007 | Sun |
| 2007/0131277 A1 | 6/2007 | Gaudiana et al. |
| 2007/0178619 A1 | 8/2007 | Forrest et al. |
| 2007/0181179 A1 | 8/2007 | Brabec et al. |
| 2007/0184576 A1 | 8/2007 | Chang et al. |
| 2007/0186971 A1 | 8/2007 | Lochun et al. |
| 2007/0190789 A1 | 8/2007 | Carter et al. |
| 2007/0193621 A1 | 8/2007 | Brabec et al. |
| 2007/0193622 A1 | 8/2007 | Sai |
| 2007/0215879 A1 | 9/2007 | Liu et al. |
| 2007/0216300 A1 | 9/2007 | Lee et al. |
| 2007/0235074 A1 | 10/2007 | Henley et al. |
| 2007/0246704 A1 | 10/2007 | Heeney et al. |
| 2007/0251570 A1 | 11/2007 | Eckert et al. |
| 2007/0267055 A1 | 11/2007 | Gaudiana et al. |
| 2007/0272296 A1 | 11/2007 | Brabec et al. |
| 2007/0295387 A1 | 12/2007 | Adriani et al. |
| 2008/0006324 A1 | 1/2008 | Berke et al. |
| 2008/0029147 A1 | 2/2008 | Yang et al. |
| 2008/0102559 A1 | 5/2008 | Ong et al. |
| 2008/0103286 A1 | 5/2008 | Ong et al. |
| 2009/0223079 A1 | 9/2009 | Myong |
| 2009/0229667 A1 | 9/2009 | Shrotriya et al. |
| 2009/0269621 A1 | 10/2009 | Lifka et al. |
| 2010/0018581 A1 | 1/2010 | Shrotriya et al. |
| 2010/0276071 A1 | 11/2010 | Li et al. |
| 2010/0290879 A1 | 11/2010 | WU et al. |
| 2011/0008926 A1 | 1/2011 | Irvin et al. |
| 2011/0124822 A1* | 5/2011 | Yu et al. ............ 525/389 |

FOREIGN PATENT DOCUMENTS

| | | |
|---|---|---|
| GB | 2308182 | 6/1997 |
| JP | 2005-206750 * | 8/2005 |
| WO | WO-93-21662 | 10/1993 |
| WO | WO-2004-112161 | 12/2004 |
| WO | WO-2006-133265 | 12/2006 |
| WO | WO-2007-005617 | 1/2007 |
| WO | WO-2007-070395 | 6/2007 |
| WO | WO-2008/011957 A1 | 1/2008 |
| WO | WO-2008-016691 | 2/2008 |
| WO | WO-2009 114832 | 9/2009 |
| WO | WO-2010-008672 A1 | 1/2010 |
| WO | WO-2011/011545 A1 | 1/2011 |
| WO | WO-2011-057191 | 5/2011 |

OTHER PUBLICATIONS

Zhenan Bao et al. "Organic field-effect transistors with high mobility based on copper phthalocyanine", Appl. Phys. Lett. 69 (20), pp. 3066-3068, Nov. 11, 1996.

Peter Beimling et al. "Synthesis of Benzo [1,2-b: 4,5-b] dithiophene and its 4,8-Dimethoxy and 4,8-Dimethyl Deiratives" Chem. Ber. 119, 3198-3203, 1986.

Martin R. Bryce et al. "Formation and Rearrangement of Adducts from Benzyne and Substituted 2,1,3-Benzoselenadiazoles" J. Chem. Soc. Perkin Trans, 1, 607-613, 1981.

Tian-An Chen et al. "Polyalkylthiophenes with the smallest bandgap and the highest intrinsic conductivity" Synthetic Metals, 60 (1993) 175-177.

Chien-Tien Chen et al. "Doubly Ortho-Linked Quinoxaline/ Diphenylfluorene Hybrids as Bipolar, Fluorescent Chameleons for Optoelectronic Applications", J. Am. Chem. Soc. 2006, 128, 10992-10993.

Stephen R. Forrest "Organic electronics are beginning to make significant inroads into the commercial world, and if the field continues to progress at its current, rapid pace, electronics based on organic thin-film materials will soon become mainstay of our technological existence. Already products based on active thin-film organic devices are in the market place, most notably the displays of several mobile electronic applicances. Yet the future holds even greater promise for this technology, with an entirely new generation of ultralow-cost, lightweight and even flexible electronic devices in the offing, which will perform functions traditionally ccomplished using much more expensive componenets based on conventional semicondcutor materials such as silicon", Nature, vol. 428, 911-918, Apr. 29, 2004, www.nature.com/nature.

Robin G. Hicks et al. "Synthesis and Electronics Structure investigation of αω-Bis(arylthio)oligothiophenese: Toward Understanding Wire-Linker Interactions in Molecular-Scale Electronic Materials", J. Chem. Soc., 122, 6746-6753, 2000.

Jianhui Hou et al. "Synthesis and Photovoltaic Properties of Two-Dimensional Conjugated Polythiophenes with Bi(thienylenevinylene) Side Chains", J. Am. Chem. Soc. 2006, 128, pp. 4911-4916.

Jianhui Hou et al. "Branched Poly(thienylene vinylene)s with Absorption Spectra Covering the Whole Visible Region", Macromolecules, 39, 4657-4662, 2006.

Ahmed Iraqi et al. "Synthesis and characterisation of telechelic regioregular head-to-tail poly (3-alkylthiophenes)" 1998.

Don D. Kenning et al. "Thieno[3,4-*b*]pyrazines: Synthese, Structure, and Reactivity", J. Org. Chem. 2002, 67, pp. 9073-9076.

Yongfang Li et al. "Electrochemical properties of luminescent polymers and polymer light-emitting electrochemical cells", Synthetic Metals 99 (1999) pp. 243-248.

Robert S. Loewe et al. "Regioregular, Head-to-Tail Coupled Poly (3-alkylthiophenes) Made Easy by the GRIM Method: Investigation of the Reaction and the Origin of Regioselectivity", Macromolecues 2001, 34, pp. 4324-4333.

L. P. Ma et al. "Organic electrical bistable devices and rewritable memory cells", Applied Physics Letters, vol. 80 No. 16, Apr. 22, 2002, pp. 2997-2999.

Fabiana S. Mancilha et al. "Are Molecular 5,8-n-Extended Quinoxaline Derivatives Good Chromophores for Photoluminescence Applications?", Eur. J. Org. Chem. 2006, pp. 4924-4933.

Richard D. McCullough et al. Enhanced Electrical Conductivity in Regioselectively Synthesized Poly (3-alkylthiophenes), J. Chem. Soc., Chem. Commun., 1992, pp. 70-72.

Norio Miyaura et al. "Palladium-Catalyzed Cross-Coupling Reactions of Organoboron Compounds", Chem. Rev. 1995, 95, pp. 2457-2483.

Hualong Pan et al. "Low-Temperature, Solution-Processed, High-Mobility Polymer Semiconductor for Thin-Film Transistors", J. Am. Chem. Soc. 2007, 129, pp. 4112-4113.

C. W. Tang et al. "Organic electroluminescent diodes", Appl. Phys. Lett. 51 (12), Sep. 21, 1987, pp. 913-915.

C. W. Tang et al. "Two-layer organic photovoltaic cell", Appl. Phys. Lett. 48 (2), 183, Jan. 3, 1986.

Hou et al, "Bandgap and Molecular Energy Level Control of Conjugated Polymer Photovoltaic Materials Based on Benzo[1,2-b:4,5-b']dithiophene," *Macromolecules*, vol. 41, No. 16, 2008.

Shahid, "Novel Thieno[3,4-b]pyrazine Based π-Conjugated Polymers for Optoelectronic Devices," Friedrich-Schiller-Universitat, jena, Aug. 1006, 2006.

International Search Report, International Application PCT/US09/55717, Nov. 2009.

Office Action for U.S. Appl. No. 12/179,387, dated Mar. 7, 2011.

International Search Report for International Application No. PCT/US2009/037197, dated Oct. 29, 2009.

International Search Report for International Application No. PCT/US2010/055829, dated Jan. 10, 2011.

International Preliminary Examination Report for International Application No. PCT/US2009/037197, dated Sep. 14, 2010.

Office Action for U.S. Appl. No. 12/179,387, dated Jul. 12, 2010, 10 pages.

Office Action for U.S. Appl. No. 12/049,252, dated May 27, 2010, 33 pages.

Office Action for U.S. Appl. No. 12/049,252, dated Dec. 1, 2009, 25 pages.

Office Action for U.S. Appl. No. 12/049,252, dated Dec. 27, 2010, 40 pages.

J. Huang et al., "Achieving High-Efficiency Polymer White-Light-Emitting Devices", Advanced Materials 2006, vol. 18, pp. 114-117.

G. Li, et al., "High-Efficiency Solution Processable Polymer Photovoltaic Cells by Self-Organization of Polymer Blends", Nature Materials, Nov. 2005, vol. 4, pp. 864-868.

V. Shrotriya et al., "Efficient Light Harvesting in Multiple-Device Stacked Structure for Polyer Solar Cells", Applied Physics Letters 88, 064104, 2006.

V. Shrotriya et al., "Transition Metal Oxides as the Buffer Layer for Polymer Photovoltaic Cells", Applied Physics Letter 88, 073508, 2006.

G. Li, et al. "Efficient Inverted Polymer Solar Cells", Applied Physics Letters 88, 253503, 2006.

C. Chu et al., "Integration of Organic Light-Emitting Diode and Organic Transistor Via a Tandem Structure", Applied Physics Letter 86, 253503, 2005.

H. Liao, et al., "Highly Efficient Inverted Polymer Solar Cell by Low Temperature Annealing of CS2C03 Interlayer", Applied Physics Letters 92, 173303, 2008.

V. Shrotriya et al., Translucent Plastic Solar Cells—Novel Devices and Their Applications, Conference, USA 2007.

Office Action for U.S. Appl. No. 12/499,460, dated Jan. 21, 2011, 9 pages.

Li et al., Manipulating regioregular poly)3-hexylthriphene) : [6,6]-phenyl-C61-butyric acid methyl ester blends-route towards high efficiency polymer solar cells, J. Mater. Chem., 2007, vol. 17, pp. 3126-3140.

PCT Search Report mailed Sep. 15, 2010 for PCT/US10/042794.

Liang et al., "Control in Energy Levels of Conjugated Polymers for Photovoltaic Application," J. Phys. Chem. C. vol. 112, pp. 7866-7871, 2008.

International Search Report for International Application No. PCT/US2009/044364, dated Aug. 27, 2009.

International Search Report for International Application No. PCT/US2010/42794, dated Sep. 15, 2010.

* cited by examiner

ACTIVE MATERIALS FOR PHOTOELECTRIC DEVICES AND DEVICES THAT USE THE MATERIALS

BACKGROUND

1. Field of Invention

Embodiments of this invention relate to active materials for electro-optic devices and electro-optic devices that use the materials; and more particularly to conjugated polymers as active layer materials for electro-optic devices.

2. Discussion of Related Art

The contents of all references cited herein, including articles, published patent applications and patents are hereby incorporated by reference.

Electronic devices based on organic materials (small molecules and polymers) have attracted broad interest. Such devices include organic light emitting devices (OLEDs) (Tang, C. W.; VanSlyke, S. A.; *Appl. Phys. Lett.* 1987, 51, 913), organic photovoltaic cells (OPVs) (Tang, C. W. *Appl. Phys. Lett.* 1986, 48, 183), transistors (Bao, Z.; Lovinger, A. J.; Dodabalapur, A. *Appl. Phys. Lett.* 1996, 69, 3066), bistable devices and memory devices (Ma, L. P.; Liu, J.; Yang, Y. *Appl. Phys. Lett.* 2002, 80, 2997), etc. Some of the most salient attributes of polymer electronics is that they can be very low-cost, flexible, operate with low-energy consumption, can be produced with high-throughput processing, and can be versatile for applications (Forrest, S. R. *Nature* 2004, 428, 911) To fulfill the requirement of low cost, a solution process is highly desirable.

Solar cells, also known as photovoltaic (PV) cells or devices, generate electrical power from incident light. The term "light" is used broadly herein to refer to electromagnetic radiation which may include visible, ultraviolet and infrared light. Traditionally, PV cells have been constructed of a number of inorganic semiconductors, e.g., crystalline, polycrystalline and amorphous silicon, gallium arsenide, cadmium telluride and others. More recently, PV cells have been constructed using organic materials.

Solar cells are characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs as well as other possible advantageous properties.

PV devices produce a photo-generated voltage when they are connected across a load and are irradiated by light. When irradiated without any external electronic load, a PV device generates its maximum possible voltage, V open-circuit, or $V_{OC}$. If a PV device is irradiated with its electrical contacts shorted, a maximum short-circuit current, or $I_{SC}$, is produced. (Current is conventionally referred to as "I" or "J".) When actually used to generate power, a PV device is connected to a finite resistive load in which the power output is given by the product of the current and voltage, I×V. The maximum total power generated by a PV device is inherently incapable of exceeding the product $I_{SC} \times V_{OC}$. When the load value is optimized for maximum power extraction, the current and voltage have values, $I_{max}$ and $V_{max}$, respectively. A figure of merit for solar cells is the fill factor, ff (or FF), defined as:

$$ff = \frac{I_{max} V_{max}}{I_{SC} V_{OC}}$$

where ff is always less than 1, as $I_{SC}$ and $V_{OC}$ are never achieved simultaneously in actual use. Nonetheless, as ff approaches 1, the device is more efficient.

When electromagnetic radiation of an appropriate energy is incident upon a semiconductive organic material, for example, an organic molecular crystal (OMC) material, or a polymer, a photon can be absorbed to produce an excited molecular state. This energy absorption is associated with the promotion of an electron from a bound state in the highest occupied molecular orbital (HOMO) to the lowest unoccupied molecular orbital (LUMO), or equivalently, the promotion of a hole from the LUMO to the HOMO. In organic thin-film photoconductors, the generated excited state is believed to be an exciton, i.e., an electron-hole pair in a bound state which is transported as a quasi-particle. The excitons can have an appreciable life-time before recombination. To produce a photocurrent the electron-hole pair must become separated, for example at a donor-acceptor interface between two dissimilar contacting organic thin films. The interface of these two materials is called a photovoltaic heterojunction. If the charges do not separate, they can recombine with each other (known as quenching) either radiatively, by the emission of light of a lower energy than the incident light, or non-radiatively, by the production of heat. Either of these outcomes is undesirable in a PV device. In traditional semiconductor theory, materials for forming PV heterojunctions have been denoted as generally being of either p(donor) type or n (acceptor) type. Here n-type denotes that the majority carrier type is the electron. This could be viewed as the material having many electrons in relatively free energy states. The p-type denotes that the majority carrier type is the hole. Such material has many holes in relatively free energy states. The type of the background majority carrier concentration depends primarily on unintentional doping by defects or impurities. The type and concentration of impurities determine the value of the Fermi energy, or level, within the gap between the highest occupied molecular orbital (HOMO) and the lowest unoccupied molecular orbital (LUMO), called the HOMO-LUMO gap. The Fermi energy characterizes the statistical occupation of molecular quantum energy states denoted by the value of energy for which the probability of occupation is equal to ½. A Fermi energy near the LUMO energy indicates that electrons are the predominant carrier. A Fermi energy near the HOMO energy indicates that holes are the predominant carrier. Accordingly, the Fermi energy is a primary characterizing property of traditional semiconductors and the PV heterojunction has traditionally been the p-n interface.

A significant property in organic semiconductors is carrier mobility. Mobility measures the ease with which a charge carrier can move through a conducting material in response to an electric field. As opposed to free carrier concentrations, carrier mobility is determined in large part by intrinsic properties of the organic material such as crystal symmetry and periodicity. Appropriate symmetry and periodicity can produce higher quantum wavefunction overlap of HOMO levels producing higher hole mobility, or similarly, higher overlap of LUMO levels to produce higher electron mobility. More- over, the donor or acceptor nature of an organic semiconductor may be at odds with the higher carrier mobility. The result is that device configuration predictions from donor/acceptor criteria may not be borne out by actual device performance. Due to these electronic properties of organic materials, the nomenclature of "hole-transporting-layer" (HTL) or "electron-transporting-layer" (ETL) is often used rather than designating them as "p-type" or "donor-type" and "n-type" or "acceptor-type". In this designation scheme, an ETL will be preferentially electron conducting and an HTL will be preferentially hole transporting.

Organic PV cells have many potential advantages when compared to traditional silicon-based devices. Organic PV cells are light weight, economical in the materials used, and can be deposited on low cost substrates, such as flexible plastic foils. However, organic PV devices typically have relatively low quantum yield (the ratio of photons absorbed to carrier pairs generated, or electromagnetic radiation to electricity conversion efficiency), being on the order of 1% or less. This is, in part, thought to be due to the second order nature of the intrinsic photoconductive process. That is, carrier generation requires exciton generation, diffusion and ionization. However, the diffusion length ($L_D$) of an exciton is typically much less than the optical absorption length, requiring a trade off between using a thick, and therefore resistive, cell with multiple or highly folded interfaces, or a thin cell with a low optical absorption efficiency.

Conjugated polymers are polymers containing π-electron conjugated units along the main chain. They can be used as active layer materials for some types of photo-electric devices, such as polymer light emitting devices, polymer solar cells, polymer field effect transistors, etc. As polymer solar cell materials, conjugated polymers should possess some properties, such as high mobility, good harvest of sunlight, good processibility, and proper molecular energy level. Some conjugated polymers have proven to be good solar cell materials. For example, some derivatives of poly(p-phenylene vinylene), such as MEH-PPV and MDMO-PPV, and some derivatives of poly(3-alky-thiophene), such as P3HT and P3OT, and some conjugated polymers with heterocyclic aromatic rings, such as poly[2,6-(4,4-bis-(2-ethylhexyl)-4H-cyclopenta[2,1-b;3,4-b']-dithiophene)-alt-4,7-(2,1,3-benzothiadiazole)] (PCPDTBT), have been successfully used as photo-active layer materials. Although the energy conversion efficiencies of solar cell devices based on these polymers have reached up to 4~5%, this is much lower than that of inorganic semiconductor solar cells. Therefore, there is accordingly a need in the art for conjugated polymers that have improved photovoltaic effects.

SUMMARY

A conjugated polymer according to an embodiments of the current invention has a repeated unit having the structure of formula (I)

(I)

wherein $A_1$, $A_2$, $R_1$ and $R_2$ are independently selected from the group consisting of hydrogen, an alkyl group having up to 18 carbon atoms, an alkoxy group comprising up to 18 carbon atoms, cyano, nitro, aryl groups and substituted aryls groups, and wherein Ar can be ethenylene; ethynylene; monocyclic, bicyclic, or polycyclic arylene; monocyclic, bicyclic, or polycyclic heteroarylene, wherein the heteroatom may be in one or more rings; or one to five of such aforementioned groups, which may be either fused or linked.

An electronic or electro-optic device according to an embodiment of the current invention includes a conjugated polymer material according to an embodiment of the current invention.

An electronic or electro-optic device according to an embodiment of the current invention has a first electrode, a second electrode spaced apart from the first electrode, and a layer of active material disposed between the first electrode and the second electrode. The active layer includes a conjugated polymer according to an embodiment of the current invention.

BRIEF DESCRIPTION OF THE DRAWINGS

The invention may be better understood by reading the following detailed description with reference to the accompanying figures in which.

DETAILED DESCRIPTION

In describing embodiments of the present invention, specific terminology is employed for the sake of clarity. However, the invention is not intended to be limited to the specific terminology so selected. It is to be understood that each specific element includes all technical equivalents which operate in a similar manner to accomplish a similar purpose.

Conjugated polymer materials for polymer solar cell should have high mobility, so the main chains of the conjugated polymers should have a planar structure according to some embodiments of the current invention. This can also be helpful to form π-π stacking structures and facilitate charge transfer between two adjacent main chains. Such materials should have a low band gap to provide good harvesting of sunlight; they also should have proper molecular energy levels that match with electrode and electron acceptor materials in polymer solar cell devices. It thus would be desirable according to some embodiments of the current invention to provide conjugated polymers as photovoltaic materials that possess some or all of the properties mentioned above.

DEFINITIONS AND NOMENCLATURE

Unless otherwise indicated, this invention is not limited to specific starting materials, regents or reaction conditions, as such may vary. The term "alkyl" as used herein refers to a branched or unbranched saturated hydrocarbon group typically, although not necessarily, containing 1 to 24 carbon atoms, such as methyl, ethyl, n-propyl, isopropyl, n-octyl, isooctyl, decyl, and the like, as well as cycloalkyl groups such as cyclopentyl, cyclohexyl and the like.

"Arylene" has its normal meaning. The term "heteroarylene" as used herein refers to an aromatic ring having five or six atoms, containing one or more "heteroatoms", i.e. an atom other than carbon, e.g., nitrogen, oxygen, sulfur, silicon, selenium, phosphorus. The term "N-containing heteroarylene" as used herein refers to a heteroarylene in which the one or more "heteroatom" as defined above is nitrogen. "Fused" rings share a common bond and "linked" rings are connected by a single bond.

The term "substituted" as in "substituted arylene", "substituted heteroarylene", and the like, refers to a moiety where at least one hydrogen atom bound to a carbon or heteroatom is replaced with one or more non-hydrogen substituents. Such substituents can include, but are not limited to, alkyl, or aryl groups and functional groups such as halo, hydroxyl, alkylthio, alkoxy, aryloxy, alkylcarbonyl, acyloxy, nitro, cyano, and the like.

Novel polymers according to some embodiments of the current invention are as follows:

The polymers according to some embodiments of the invention are comprised of repeated units having the general structure of formula (I)

(I)

wherein: $A_1$, $A_2$, $R_1$ and $R_2$ are independently selected from hydrogen; alkyl, alkoxy groups with up to 18 C atoms, cyano, nitro, aryls groups and substituted aryls groups. Ar can be substituted or unsubstiuted ethenylene; ethynylene; monocyclic, bicyclic and polycyclic arylene; monocyclic, bicyclic and polycyclic heteroarylene; or one to five of such aforementioned groups, typically one to three such groups, that are either fused or linked. When substituted, the Ar group can have one or two substituents that are independently aryl, alkyl, alkoxy having from 1-18 carbon atoms, or two adjacent carbons on the Ar group may be substituted to together form an ethylene dioxy group.

In some embodiments, Ar is monocyclic, bicyclic or tricyclic heteroarylene having one to six heteroatoms independently selected from nitrogen, sulfur and selenium, where Ar is optionally substituted with phenyl, alkyl, nitro or ethylenedioxy. In some embodiments, Ar is a monocyclic heteroarylene containing S, optionally fused to an arylene or a heteroarylene. In some embodiments, Ar is a monocyclic heteroarylene containing from one to four nitrogen atoms, optionally containing one or two sulfur atoms, and optionally fused to one or more arylenes or a heteroarylenes. In other embodiments, Ar is unsubstituted. Embodiments of the invention include compounds where $R_1=R_2=$dodecyloxy. In other embodiments, $R_1=R_2=$dodecyloxy and $A_1=A_2=$H.

Examples of suitable Ar moieties include, but are not limited to, the following or the substituted units as the following:

-continued

In the above structures, R is an alkyl group with carbon atom number of 1-18.

Embodiments of the invention include those where Ar is one of: 2,3-diphenylquinoxaline-5,8-diyl;
2,1,3-benzothiadiazole-4,7-diyl;
thieno[3,4-b]pyrazine-5,7-diyl;
3,4-ethylenedioxythiophene-2,5-diyl;
(E)-1,2-vinylenethiophene-2,5-diyl;
benzo[c][1,2,5]selenadiazole-4,7-diyl;
5,5'-(2,2'-(4,7-benzo[c][1,2,5]thiadiazole-diyl)-bis(3-hexylthiohene)-diyl; or thiophene-2,5-diyl.

In embodiments, the compound of formula (I) is one of:
Poly[4,8-didodecyloxy-benzo[1,2-b; 3,4-b]dithiophene-2,6-diyl]-Co-[2,3-diphenylquinoxaline-5,8-diyl];
Poly[4,8-didodecyloxy-benzo[1,2-b; 3,4-b]dithiophene-2,6-diyl]-Co-[2,1,3-benzothiadiazole-4,7-diyl];
Poly[4,8-didodecyloxy-benzo[1,2-b; 3,4-b]dithiophene-2,6-diyl]-Co-[thieno[3,4-b]pyrazine-5,7-diyl];
Poly[4,8-didodecyloxy-benzo[1,2-b;3,4-b]dithiophene-2,6-diyl]-Co-[3,4-ethylenedioxythiophene-2,5-diyl];
Poly[4,8-didodecyloxy-benzo[1,2-b; 3,4-b]dithiophene-2,6-diyl]-Co-[(E)-1,2-vinylene];
Poly[4,8-didodecyloxy-benzo[1,2-b; 3,4-b]dithiophene-2,6-diyl]-Co-[thiophene-2,5-diyl];
Poly[4,8-didodecyloxy-benzo[1,2-b;3,4-b]dithiophene-2,6-diyl]-Co-[benzo[c][1,2,5]selenadiazole-4,7-diyl];
Poly[4,8-didodecyloxy-benzo[1,2-b; 3,4-b]dithiophene-2,6-diyl]-Co-[5,5'-(2,2'-(4,7-benzo[c][1,2,5]thiadiazole-diyl)-bis(3-hexylthiohene)-diyl); or
Poly[4,8-d]dodecyloxy-benzo[1,2-b;3,4-b]dithiophene-2,6-diyl]-Co-[3,4-ethylenedioxythiophene-2,5-diyl].

Some embodiments of polymers of formula (I) are comprised of repeated units having the structure of formula (II)

wherein: R1, R2 and Ar are as defined above. In this embodiment, some more particular examples for when enhanced solubility is desired are polymers wherein R1 and R2 are selected from alkyl groups with 4-12 carbon atoms or alkoxy groups with 4-12 carbon atoms and Ar is N-containing heteroarylene. In exemplary embodiments, R1 and R2 are independently selected from alkyl groups with up to 18 carbon atoms and alkoxy groups with up to 18 carbon atoms, and Ar is one of the units as shown below or the substituted units as shown below In another embodiment, polymers of formula (I) are comprised of repeated units having the structure of formula (III)

Wherein: $R_1$, $R_2$, $R_3$ and $R_4$ are independently selected from alkyl groups with up to 18 carbon atoms or alkoxy groups with up to 18 carbon atoms; $Ar_1$ is a N-containing heteroarylene. Exemplary N-containing heteroarylenes include but are not limited to the following:

or the substituted units as the following:

In some embodiments of compounds according to formula (III), for example when enhanced solubility is desired, $R_1$ and $R_2$ can be the same or different alkyl groups with 4-12 carbon atoms can be used.

Typically, the number average molecular weight of the polymers is in the range of approximately 1000 to 1,000,000, which can further have a number average molecular weight in the range of about 5000 to 500,000, and can further have a number average molecular weight in the range of approximately 20,000 to 200,000. It will be appreciated that molecular weight can be varied to optimize polymer properties. For example, lower molecular weight is can ensure solubility, while a higher molecular weight can ensure good film-forming properties.

Polymerization:

The polymers according to some embodiments of the invention are generally synthesized by co-polymerizing monomers having the structure of formula (IV) and formula (V), wherein formula (IV) and formula (V): R1, R2, A1, A2 and Ar are as defined above; X is dependently selected on Y. If Y is selected from a boronic acid group, or boric acid esters groups including, but not being limited to, 1,3,2-dioxaborinane-2-yl, 4,4,5,5-tetramethyl-1,3,2-dioxaborolane-2-yl, and 5,5-dimethyl-1,3,2-dioxaborinane-2-yl, or magnesium halide groups including magnesium chloride, magnesium bromide, and magnesium iodide, or zinkhalide groups including zinkchloride and zinkbromide, or trialkyltin groups including, but not limited to, trimethyl tin, triethyl tin, and tributyl tin, X should be selected from 1, Br, or Cl, and if Y is selected from 1, Br, or Cl, X should be selected from a boronic acid group, or boric acid esters groups including, but not being limited to, 1,3,2-dioxaborinane-2-yl, 4,4,5,5-tetramethyl-1,3,2-dioxaborolane-2-yl, and 5,5-dimethyl-1,3,2-dioxaborinane-2-yl, or magnesium halide groups including magnesium chloride, magnesium bromide, and magnesium iodide, or zinkhalide groups including zinkchloride and zinkbromide, or trialkyltin groups including, but not being limited to, trimethyl tin, triethyl tin, and tributyl tin.

A polymerization route of the polymers according to some embodiments of the invention using monomers as mentioned in formula (IV) and (V) is shown as the following scheme.

wherein: A1, A2, R1, R2, Ar, X, and Y are defined as above.

If the condensation polymerization reaction is conducted between a dimagnesiohalo-arene compound and an arene dihalide compound, the polymerization reaction is a typical 'McCullough method', as reported by McCullough and Lowe [J. Chem. Soc., Chem. Commun. 1992, 70.]. In McCullough's method, THF is used as a solvent commonly, and a mixture of toluene and THF can also sometimes be used. Some catalysts containing Pd or Ni, for example [1,3-bis(diphenylphosphino)propane]dichloronickel(II) and tetrakis(triphenylphosphine)palladium(0), can be used as catalysts for this reaction, and the molar ratio between the catalyst and the starting material is in the range of 10-0.1%. The reaction is typically conducted at about 10° C. to refluxing point of the solvent. Depending on the reactivities of the reactants, the polymerization may take 30 minutes to 24 hours. Dimagnesiohalo-arene used in this reaction can be prepared from Grignard metathesis reaction, as reported by Loewe and McCullough [*Macromolecules*, 2001, (34), 4324-4333], or reaction between arene dihalide and magnesium. In some embodiments, arene dihalide and Dimagnesiohalo-arene used in the 'McCullough method' for the polymers of the invention are arene dibromide and dimagnesiobromo-arene.

If the condensation polymerization reaction is conducted between a dizinkhaloarene compound and an arene dihalide compound, the polymerization reaction is a typical 'Rieke method', as reported by Chen and Rieke [*Synth. Met.* 1993, (60), 175.]. In this method, THF is used as a solvent commonly, and some catalysts containing Pd or Ni, for example [1,2-Bis(diphenylphosphino)ethane]dichloronickel(II), can be used as catalyst for this reaction, and the molar ratio between catalyst and starting material is in the range of 10-0.1%. The reaction is typically conducted at about 10° C. to refluxing point of the solvent. Depending on the reactivities of the reactants, the polymerization may take 30 minutes to 24 hours.

In preferred embodiments, arene dihalide and dizinkhaloarene used in 'Rieke method' for the polymers of the invention are arene dibromide and dizinkchloro-arene.

If the condensation polymerization reaction is conducted between a bis(trialkylstannyl)-arene compound and an arene dihalide, the polymerization reaction is a typical 'Stille coupling method', as reported by Iraqi and Barker [*J. Mater. Chem.* 1998, (8) 25]. In this method, many kinds of solvents including, but not limited to, tetrahydrofuran (THF), Dimethyl Formamide (DMF), and toluene can be used as a solvent commonly, and some catalysts containing Pd, for example tetrakis(triphenylphosphine)palladium(0), can be used as catalysts for this reaction, and the molar ratio between catalyst and starting material is in the range of 10-0.1%. The reaction is typically conducted at about 60° C. to refluxing point of the solvent. Depending on the reactivities of the reactants, the polymerization may take 1 to 72 hours. In some embodiments, arene dihalide and dizinkhalo-arene used in 'Stille coupling method' for the polymers of the invention are arene dibromide and dizinkchloro-arene.

If the condensation polymerization reaction is conducted between an arene-diboronic acid compound or an arene-diboric acid ester compound and an arene dihalide, the polymerization reaction is a typical 'Suzuki reaction', as reported by Miyaura and Suzuki [*Chemical reviews* 1995 (95): 2457-2483]. In this method, many kinds of solvents including, but not limited to, THF, and toluene can be used as a solvent commonly, and some catalysts containing Pd, for example tetrakis(triphenylphosphine)palladium(0), can be used as catalysts for this reaction, and the molar ratio between catalyst and starting material is in the range of 10-0.1%. The reaction is typically conducted at about 60° C. to refluxing point of the solvent. Depending on the reactivities of the reactants, the polymerization may take 12 to 72 hours. In some embodiments, arene dihalide used in a 'Suzuki reaction' for the polymers of some embodiments of the invention is arene dibromide or dizinkchloro-arene.

Generally, the polymers according to some embodiments of the invention are useful in any application wherein a conjugated polymer, particularly a conjugated photovoltaic polymer, would have utility. For example, the present polymers can be suitable as the active materials in the following devices: thin film semiconductor devices such as solar cells, light emitting diodes, transistors, photodetectors, and photoconductors; electrochemical devices such as rechargeable batteries, capacitors, supercapacitors, and electrochromic devices, and sensors.

Semiconductive compositions may be prepared that comprise a polymer according to an embodiment of the invention optionally combined with an admixer, typically a compound selected such that charge and/or energy transfer takes place between the admixer and the polymer when an excitation source including light or voltage is applied across the composition. For example, the admixer can be fullerene such as: $C_{60}$, $C_{70}$, or $C_{80}$, or some substituted fullerene compounds such as PCBM ([6,6]-phenyl $C_{61}$ butyric acid methyl ester) and PCBB ([6,6]-phenyl $C_6$ butyric acid butyl ester). Polymers according to some embodiments of the invention are particularly useful as photovoltaic materials in photovoltaic devices such as photodetector devices, solar cell devices, and the like. Photovoltaic devices, including solar cell devices, are generally comprised of laminates of a suitable photovoltaic material between a hole-collecting electrode layer and an electron-collecting layer. Additional layers, elements or a substrate may or may not be present.

Figure 1:
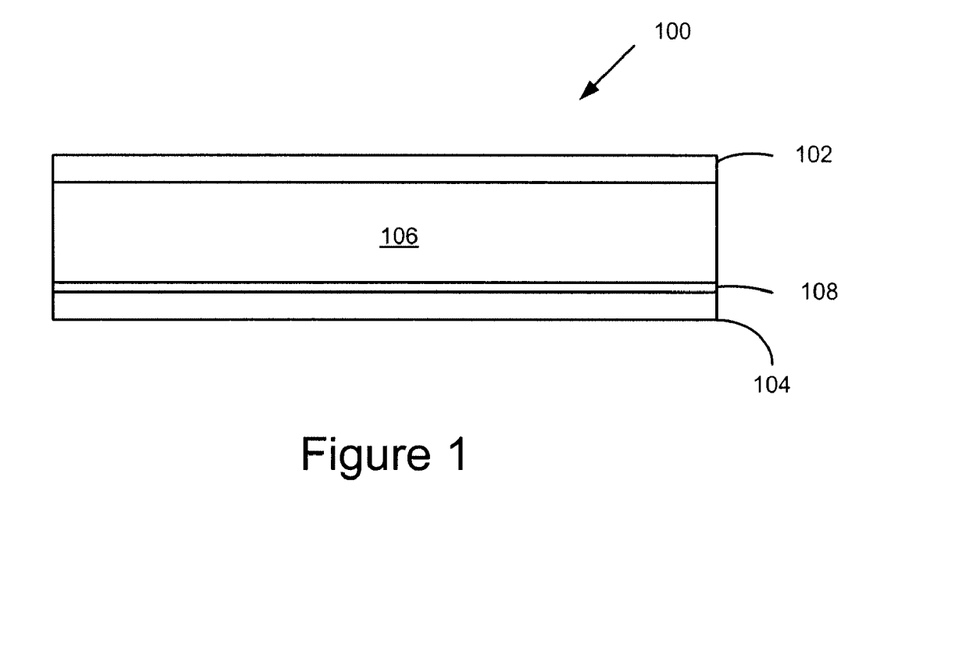
FIG. 1 is a schematic illustration of an electro-optic device according to an embodiment of the current invention.

FIG. 1 is a schematic illustration of an electro-optic device 100 according to an embodiment of the current invention. The electro-optic device 100 has a first electrode 102, a second electrode 104 spaced apart from the first electrode 102, and an active layer 106 disposed between the first electrode and the second electrode. The electro-optic device 100 can have multiple layers of active materials and/or layers of material between the electrodes and the active layer such as the layer 108, for example. The active layer can include a conjugated polymer material according to one or more embodiments of the current invention. One or both of the electrodes 102 and 104 can be transparent electrodes in some embodiments of the current invention.

Figure 2:
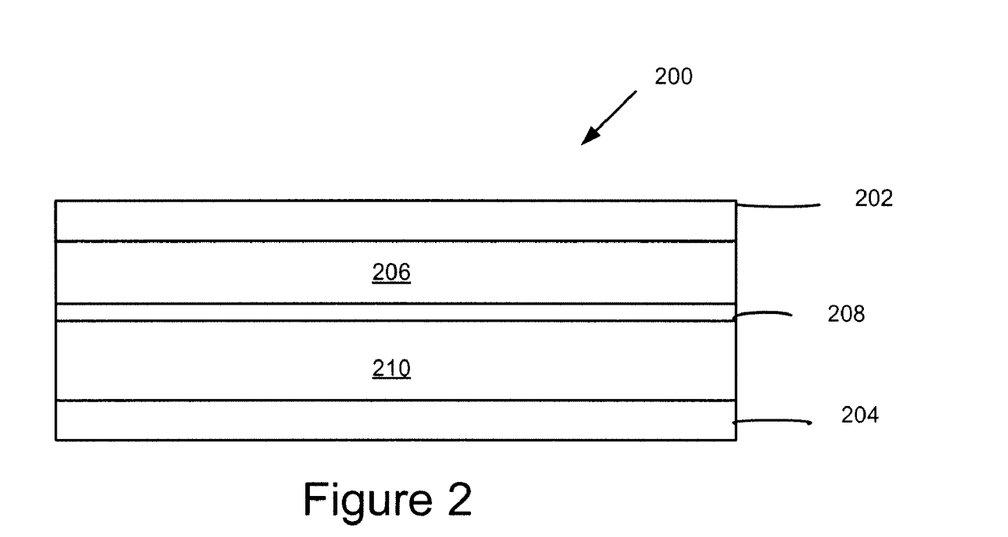
FIG. 2 is a schematic illustration of an electro-optic device according to another embodiment of the current invention.

FIG. 2 is a schematic illustration of an electro-optic device 200 according to another embodiment of the current invention. The electro-optic device 200 has a first electrode 202, a second electrode 204 spaced apart from the first electrode 202, and an active layer 206 disposed between the first electrode and the second electrode. This embodiment is an example of an electro-optic device that has a second active layer 210 between the first electrode 202 and the second electrode 204. The electro-optic device 200 can have additional layers of material between the active layers and the electrodes and/or between the two active layers. For example, there could be a layer 208 between the active layers 206 and 210. Devices according to the current invention are not limited to only one or two active layers; they may have multiple active layers in some embodiments of the current invention. The schematic illustrations of FIGS. 1 and 2 are shown as examples. Devices according to other embodiments of the current invention are not limited to these specific examples.

EXPERIMENTAL

The practice of the present invention can employ conventional techniques of polymer chemistry, which are within the skill of the art. In the following examples, efforts have been made to ensure accuracy with respect to numbers used, including amounts, temperature, reaction time, etc., but some experimental error and deviation should be accounted for. Temperature used in the following examples is in degrees C, and the pressure is at or near atmospheric. All solvents were purchased as HPLC grade, and all reactions were routinely conducted under an inert atmosphere of argon. All regents were obtained commercially unless otherwise indicated.

Example 1

Synthesis of 2,6-bis(trimethylstannyl)-4,8-didodecyloxy-benzo[1,2-b:4,5-b']dithiophene 4,8-Dihydrobenzo[1,2-b:4,5-b']dithiophen-4,8-dion, which is synthesized as the method published by Beimling [*Chem. Ber.* 1986; (119) 3198-3203.], Zinc powder (2.86 g, 44 mmol), and 60 ml of water were put into a 250 ml flask, then 12 g of NaOH was added. The mixture was well stirred and heated to reflux for one hour. Then, 1-bromo-dodecane (15 g, 60 mmol) and a catalytic amount of tetrabutyl ammonium bromide were added into the flask. The reactant was refluxed for 6 hours and poured into cold water, and extracted by 200 ml of diethyl ether for two times. The ether layer was dried over anhydrous $MgSO_4$. After removing solvent, the crude product was purified by recrystallization from ethyl alcohol for two times. 9.26 g of 4,8-didodecyloxy-benzo[1,2-b; 3,4-b]dithiophene, was obtained as colorless crystal. $^1H$ NMR ($CDCl_3$): 7.66 (d, 2H), 7.47 (d, 2H), 4.26 (t, 4H), 1.87 (quintuple, 4H), 1.53 (m, 4H), 1.37-1.27 (m, 32H), 0.88 (t, 6H).

4,8-didodecyloxy-benzo[1,2-b; 3,4-b]dithiophene (5.58 g, 10 mmol) was solved into 100 ml methylene chloride in a 250 ml flask. Bromine (3.2 g, 20 mmol) was solved into 60 ml methylene chloride in a funnel and slowly dropped into the flask under ice-water bath, and then, the reactant was stirred for 4-6 hours at ambient temperature. All of volatile substances were removed under vacuum. The residue was recrystallized by hexane for two times. 6.37 g of 2,6-dibromo-4,8-didodecyloxy-benzo[1,2-b; 3,4-b]dithiophene was obtained as white solid.

$^1H$ NMR ($CDCl_3$): 7.43 (s, 2H), 4.17 (t, 4H), 1.83 (quintuple, 4H), 1.54 (m, 4H), 1.36-1.27 (m, 32H), 0.89 (t, 6H).

2,6-dibromo-4,8-didodecyloxy-benzo[1,2-b; 3,4-b]dithiophene (4.30 g, 6 mmol) and 100 ml of THF were added into a flask under inert atmosphere. The solution was cooled down to $-78°$ C. by a liquid nitrogen-acetone bath, and 4.55 ml of n-butyl lithium (13.2 mmol, 2.9M in n-hexane) was added dropwise. After being stirred at $-78°$ C. for 1 hour, a great deal of white solid precipitate appeared in the flask. Then, 14 mmol of trimethyltin chloride (14 ml, 1M in n-hexane) was added in one portion, and the reactant turned to clear rapidly. The cooling bath was removed, and the reactant was stirred at ambient temperature for 2 hours. Then, it was poured into 200 ml of cool water, and extracted by ether for 3 times. The organic layer was washed by water two times, and then dried by anhydrous $MgSO_4$. After removing solvent under vacuum, the residue was recrystallized by ethyl alcohol for two times. 6.7 g of 2,6-bis(trimethyltin)-4,8-didodecyloxy-benzo[1,2-b; 3,4-b]dithiophene was obtained as colorless needle crystal.

Example 2

Synthesis of Poly[4,8-didodecyloxy-benzo[1,2-b; 3,4-b]dithiophene-2,6-diyl]-Co-[2,3-diphenylquinoxaline-5,8-diyl]

5,8-dibromo-2,3-diphenylquinoxaline (0.44 g, 1 mmol, prepared according to Chen [*J. Am. Chem. Soc.*, 2006, (128) 10992-10993]), 2,6-bis(trimethyltin)-4,8-didodecyloxy-benzo[1,2-b;3,4-b]-dithiophene, and 50 ml of toluene were put into a two-necked flask with oil bath. The solution was flushed with argon for 10 minutes, then 20 mg of $Pd(PPh_3)_4$ was added into the flask. The solution was flushed again for 20 minutes. The oil bath was heated to 110° C. carefully, and the reactant was stirred for 16 hours at this temperature under argon atmosphere. Then, the reactant was cooled to room temperature and the polymer was precipitated by addition of 100 ml methanol, and filtered through a Soxhlet thimble, which was then subjected to Soxhlet extraction with methanol hexane, and chloroform. The polymer was recovered as a solid sample from the chloroform fraction by rotary evaporation. The solid was dried under vacuum for 1 day to get the final product.

Example 3

Synthesis of Poly-2,6-(4,8-didodecyloxy-benzo[1,2-b; 3,4-b]dithiophene)

The procedure of example 2 was followed, except that 0.71 g of 2,6-dibromo-4,8-didodecyloxy-benzo[1,2-b; 3,4-b]dithiophene was used in stead of 5,8-dibromo-2,3-diphenylquinoxaline.

Example 4

Synthesis of Poly[4,8-didodecyloxy-benzo[1,2-b; 3,4-b]dithiophene-2,6-diyl]-Co-[2,1,3-benzothiadiazole-4,7-diyl]

The procedure of example 2 was followed, except that 0.294 g of 4,7-Dibromo-2,1,3-benzothiadiazole (prepared according to Fabiana S Mancilha, [*J. Org. Chem.;* 2006, (21) 4924-4933] was used instead of 5,8-dibromo-2,3-diphenylquinoxaline.

Example 5

Synthesis of Poly[4,8-didodecyloxy-benzo[1,2-b; 3,4-b]dithiophene-2,6-diyl]-Co-[thieno[3,4-b]pyrazine-5,7-diyl]

Thieno[3,4-b]pyrazine (0.272 g, 2 mmol, prepared according to Kenning [*J. Org. Chem.*, 2002, (67), 9073-9076] was dissolved into 20 ml of dimethyl formamide, and then, 0.712 g of N-bromo-succinamide was added. The reactant was stirred for 2 hours at ambient temperature. 50 ml of water was added, and the mixture was extracted by 100 ml of ethyl ether for 3 times. After removing solvent, the crude product was purified by silica gel column using methylene chloride as eluent, and 5,7-dibromo-thieno[3,4-b]pyrazine was obtained as yellow solid.

Then, the procedure of example 2 was followed, except that 0.294 g of 5,7-dibromo-thieno[3,4-b]pyrazine was used in stead of 5,8-dibromo-2,3-diphenylquinoxaline.

Example 6

Synthesis of Poly[4,8-didodecyloxy-benzo[1,2-b; 3,4-b]dithiophene-2,6-diyl]-Co-[3,4-ethylenedioxythiophene-2,5-diyl]

The procedure of example 2 was followed, except that 0.294 g of 2,5-Dibromo-3,4-ethylenedioxythiophene (prepared according to Robin G. Hicks, [J. Am. Chem. Soc.; 122; 28; 2000; 6746-6753.]) was used instead of 5,8-dibromo-2, 3-diphenylquinoxaline.

Example 7

Synthesis of Poly[4,8-didodecyloxy-benzo[1,2-b;
3,4-b]dithiophene-2,6-diyl]-Co-[(E)-1,2-vinylene]

The procedure of example 2 was followed, except that 0.626 g of (E)-1,2-bis(tributylstannyl)ethylene (prepared according to Jianhui Hou and Yongfang Li, [Macromolecules, 39 (14), 4657-4662, 2006]) was used instead of 2,6-bis(trimethyltin)-4,8-didodecyloxy-benzo[1,2-b;3,4-b]dithiophene, and 2,6-dibromo-4,8-didodecyloxy-benzo[1,2-b; 3,4-b]dithiophene (0.716 g, 1 mmol) was used instead of 5,8-dibromo-2,3-diphenylquinoxaline.

Example 8

Synthesis of Poly[4,8-didodecyloxy-benzo[1,2-b;
3,4-b]dithiophene-2,6-diyl]-Co-[thiophene-2,5-diyl]

The procedure of example 2 was followed, except that 0.716 g of 2,6-dibromo-4,8-didodecyloxy-benzo[1,2-b; 3,4-b]dithiophene was used instead of 5,8-dibromo-2,3-diphenylquinoxaline, and 0.662 g of (E)-1,2-bis(tributylstannyl)thiophene (prepared according to Jianhui Hou and Yongfang Li, [*J. Am. Chem. Soc.*, 128 (14), 4911-4916, 2006.]) was used instead of 2,6-bis(trimethyltin)-4,8-didodecyloxy-benzo[1,2-b;3,4-b]dithiophene.

Example 9

Synthesis of Poly[4,8-didodecyloxy-benzo[1,2-b;
3,4-b]dithiophene-2,6-diyl]-Co-[benzo[c][1,2,5]selenadiazole-4,7-diyl]

The procedure of example 2 was followed, except that 0.294 g of 4,7-dibromobenzo[c][1,2,5]selenadiazole (prepared according to Martin R. Bryce [*J. Chem. Soc. Perkin Trans.* 1981, (1) 607-613] was used instead of 5,8-dibromo-2,3-diphenylquinoxaline.

Example 10

Synthesis of Poly[4,8-didodecyloxy-benzo[1,2-b;3,
4-b]dithiophene-2,6-diyl]-Co-[5,5'-(2,2'-(4,7-benzo
[c][1,2,5]thiadiazole-diyl)-bis(3-hexylthiohene)-diyl)

The procedure of example 2 was followed, except that 0.627 g of 4,7-bis(5-bromo-3-hexylthiophen-2-yl)-benzo[c][1,2,5]thiadiazole was used instead of 5,8-dibromo-2,3-diphenylquinoxaline.

Example 11

Processability and Optical Band Gap Measurement by Absorption Spectra

The polymers prepared in example 2, 3, 4, 5, 6, 7, 8, 9 and 10 were admixed with various organic solvent, including chlorinated solvents such as chloroform, methylene chloride, chlorobenzene and dichlorobenzene, and other solvents such as methanol, toluene, tetrahydrofuran. The polymers prepared in example 1, 2, 4, 5, 6, 7, 8, and 9 were found to have good solubility in the chlorinated solvent, but were insoluble in methanol. High quality thin films were prepared by spin-coating the polymer solutions onto glass slides. The polymer prepared in example 3 was found to be insoluble in all of the solvent at ambient temperature, but it has good solubility in toluene and chlorobenzene at above 75° C.

Figure 3:
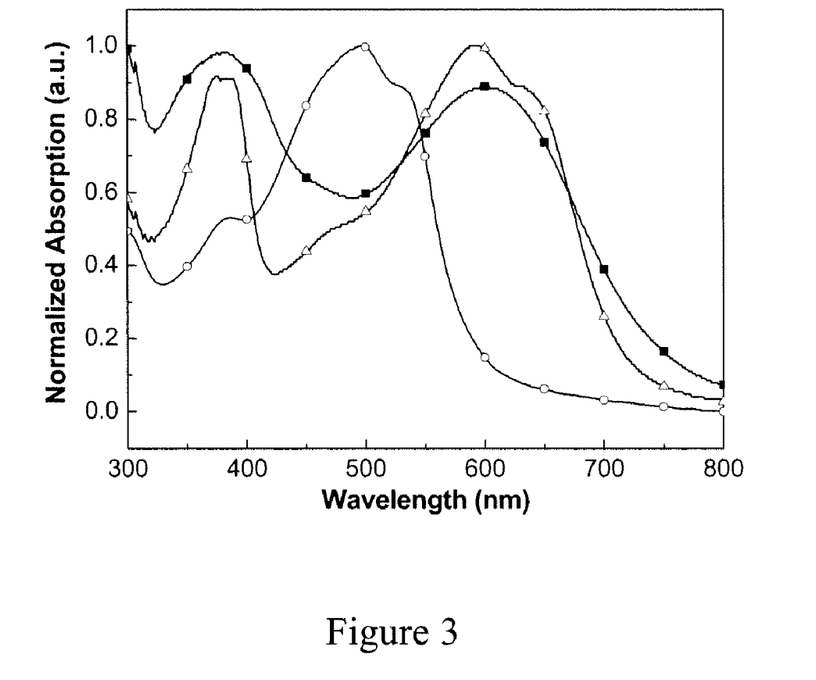
FIG. 3 shows absorption spectra of the polymers: Poly[4,8-didodecyloxy-benzo[1,2-b; 3,4-b]dithiophene-2,6-diyl]-Co-[2,3-diphenylquinoxaline-5,8-diyl](the line with solid square), Poly[-2,6-(4,8-didodecyloxy-benzo[1,2-b; 3,4-b]dithiophene)] (the line with hollow circle), and Poly[4,8-didodecyloxy-benzo[1,2-b; 3,4-b]dithiophene-2,6-diyl]-Co-[2,1,3-benzothiadiazole-4,7-diyl] (the line with hollow triangle)
Figure 4:
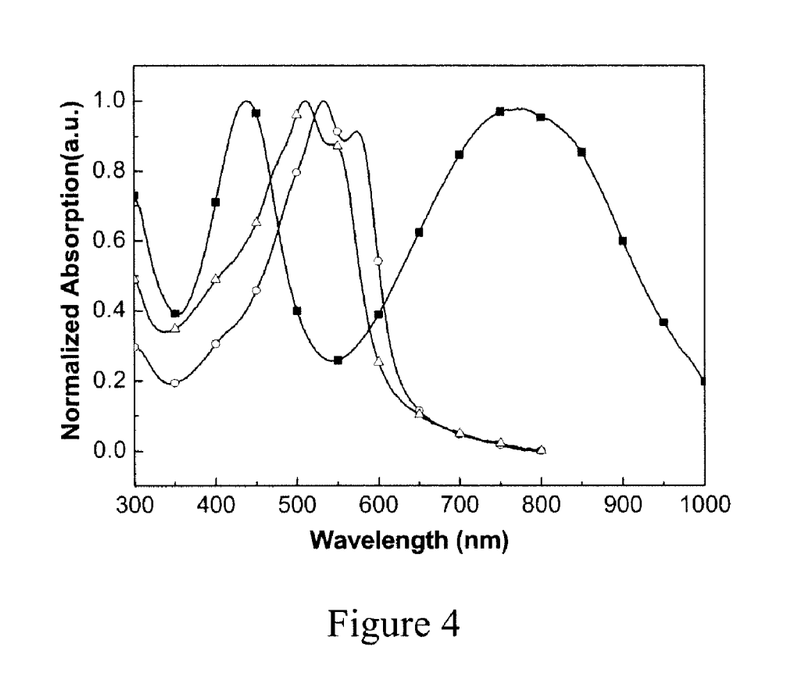
FIG. 4 shows absorption spectra of the polymers: Poly[4,8-didodecyloxy-benzo[1,2-b; 3,4-b]dithiophene-2,6-diyl]-Co-[thieno[3,4-b]pyrazine-5,7-diyl] (the line with solid square), Poly[4,8-didodecyloxy-benzo[1,2-b;3,4-b]dithiophene-2,6-diyl]-Co-[3,4-ethylenedioxythiophene-2,5-diyl] (the line hollow circle), and Poly[4,8-didodecyloxy-benzo[1,2-b; 3,4-b]dithiophene-2,6-diyl]-Co-[(E)-1,2-vinylene] (the line with hollow triangle)
Figure 5:
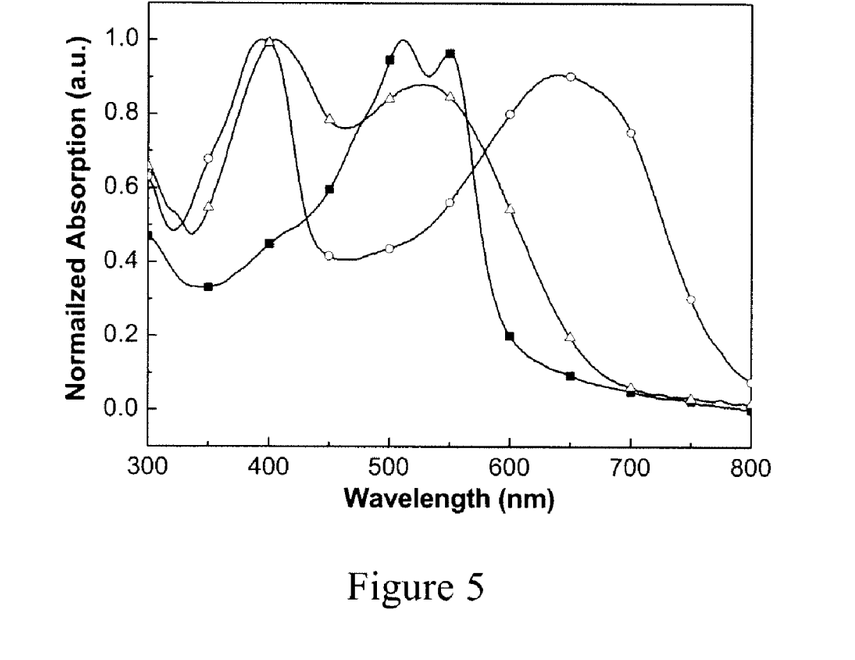
FIG. 5 shows absorption spectra of the polymers: Poly[4,8-didodecyloxy-benzo[1,2-b; 3,4-b]dithiophene-2,6-diyl]-Co-[thiophene-2,5-diyl] (the line with solid square), Poly[4,8-didodecyloxy-benzo[1,2-b;3,4-b]dithiophene-2,6-diyl]-Co-[benzo[c][1,2,5]selenadiazole-4,7-diyl] (the line with hollow circle), and Poly[4,8-didodecyloxy-benzo[1,2-b; 3,4-b]dithiophene-2,6-diyl]-Co-[5,5'-(2,2'-(4,7-benzo[c][1,2,5]thiadiazole-diyl)-bis(3-hexylthiohene)-diyl) (the line with hollow triangle)

The measured absorption spectra of the polymer films are shown in FIGS. 3, 4 and 5. Optical band gaps of the polymers were calculated using the empirical formula (Eg=1240/$\lambda_{max}$, wherein: Eg is optical band gap of polymer; $\lambda$max is the onset point of absorption spectrum at long wavelength direction) and presented in Table 1.

Example 12

Highest Occupied Molecular Orbital (HOMO) Measurement by Electrochemical Cyclic Voltammetry Method The method according to Yongfang Li [*Synth. Met.*, 1999, (99)], 243.] was used to determine the HOMO level of the polymers. The polymer (2.0 mg) prepared in Example 1 was solved into 1 ml of toluene, and then a small drop of this solution was cast onto a platinum plate electrode, which was used as work electrode; 0.1 mol/L Bu$_4$NPF$_6$, CH$_3$CN solution was used as supporting electrolyte; platinum was used as a counter electrode; a silver wire was used as a semi-reference electrode.

Figure 6:
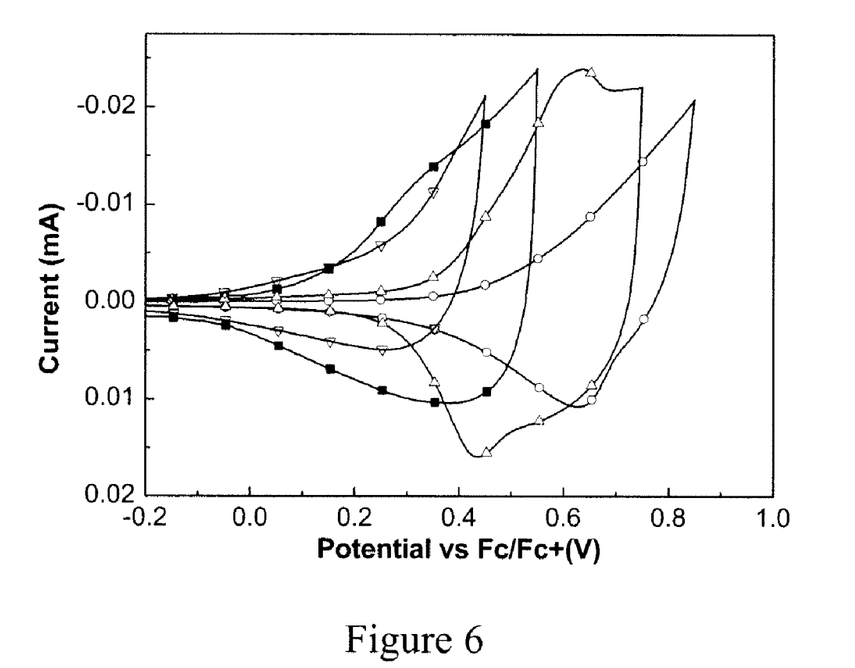
FIG. 6 shows cyclic voltammograms of the polymer films on platinum electrode in 0.1 mol/L $Bu_4NPF_6$, $CH_3CN$ solution: Poly[4,8-didodecyloxy-benzo[1,2-b; 3,4-b]dithiophene-2,6-diyl]-Co-[2,3-diphenylquinoxaline-5,8-diyl] (the line with solid square), Poly[-2,6-(4,8-didodecyloxy-benzo[1,2-b; 3,4-b]dithiophene)] (the line with hollow circle), Poly[4,8-didodecyloxy-benzo[1,2-b; 3,4-b]dithiophene-2,6-diyl]-Co-[2,1,3-benzothiadiazole-4,7-diyl] (the line with hollow triangle), and Poly[4,8-didodecyloxy-benzo[1,2-b; 3,4-b]dithiophene-2,6-diyl]-Co-[thieno[3,4-b]pyrazine-5,7-diyl] (the line with solid triangle)
Figure 7:
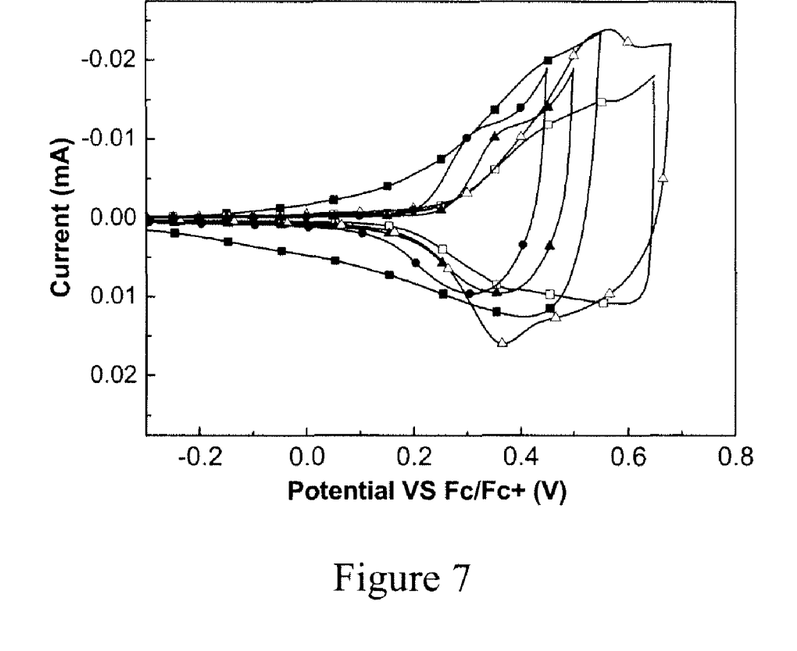
FIG. 7 shows cyclic voltammograms of the polymer films on platinum electrode in 0.1 mol/L $Bu_4NPF_6$, $CH_3CN$ solution: Poly[4,8-didodecyloxy-benzo[1,2-b;3,4-b]dithiophene-2,6-diyl]-Co-[3,4-ethylenedioxythiophene-2,5-diyl] (the line with solid square), Poly[4,8-didodecyloxy-benzo[1,2-b; 3,4-b]dithiophene-2,6-diyl]-Co-[(E)-1,2-vinylene] (the line with hollow square), Poly[4,8-didodecyloxy-benzo[1,2-b; 3,4-b]dithiophene-2,6-diyl]-Co-[thiophene-2,5-diyl] (the line with solid triangle), Poly[4,8-didodecyloxy-benzo[1,2-b;3,4-b]dithiophene-2,6-diyl]-Co-[benzo[c][1,2,5]selenadiazole-4,7-diyl] (the line with hollow triangle), and Poly[4,8-didodecyloxy-benzo[1,2-b;3,4-b]dithiophene-2,6-diyl]-Co-[5,5'-(2,2'-(4,7-benzo[c][1,2,5]thiadiazole-diyl)-bis(3-hexylthiohene)-diyl) (the line with solid circle)

Electrochemical cyclic voltammetry measurement was performed in this system. The same procedure was repeated to determine the HOMO level of the other polymers in the invention. The cyclic voltammetry data of the polymers of the invention are shown in FIGS. 6 and 7, and the data of HOMO level of the polymers of the invention are presented in Table 1

Example 13

Open Circuit Voltage of the Polymer Solar Cell Device

One of the polymers prepared in Examples 2, 3, 4, 5, 6, 7, 8, 9 and 10 (30 mg) was dissolved in chlorobenezene to make 20 mg ml$^{-1}$ solution, followed by blending with PCBM in 50 wt. %. Polymer solar cell were fabricated on a transparent, indium-tin oxide (ITO) coated glass substrate. A thin layer of a conducting polymer, poly(styrenesulfonate) doped poly(3, 4-ethylenedioxy-thiophene) (PEDOT:PSS), was spin-coated onto the ITO surface for a better interface. The thickness of the PEDOT:PSS layer was about 30 nm, measured with Dektek profilometer. Then, a thin layer was spin-coated using the solution prepared above. Then, thin layers of calcium and aluminum were evaporated successively at pressure around 10$^{-4}$ Pa. Testing was performed in a N$_2$ filled glove box under AM 1.5 G irradiation (100 mW cm$^{-2}$) using a Xenon lamp solar simulator calibrated with a silicon diode (with KG5 visible filter) calibrated in National Renewable Energy Laboratory (NREL).

The open circuit voltage of the polymer solar cell devices are presented in Table 1. The open circuit voltage of the devices based on the polymers of the invention changed from 0.1 V to 0.96 V, because of the different HOMO level of the polymers.

Example 14

Photovoltaic properties of the polymer solar cell device based on Poly[4,8-didodecyloxy-benzo[1,2-b; 3,4-b]dithiophene-2,6-diyl]-Co-[thiophene-2,5-diyl]/ PCBM (1:1 wt/wt)

Figure 8:
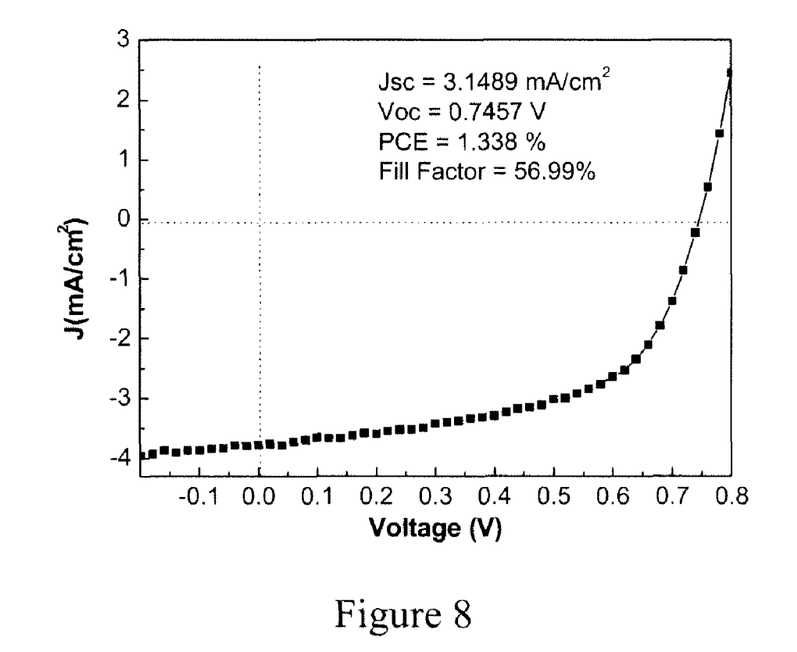
FIG. 8 shows an I-V curve of the polymer solar cell device with a structure of ITO/PEDOT:PSS/Poly[4,8-didodecyloxy-benzo[1,2-b; 3,4-b]dithiophene-2,6-diyl]-Co-[thiophene-2,5-diyl]/PCBM (1:1 wt/wt)/Ca/Al.

The procedure of example 13 was followed to fabricate and characterize the polymer solar cell device. The I-V curve of the device is shown in FIG. 8.

The current invention was described with reference to particular embodiments and examples. However, this invention is not limited to only the embodiments and examples described. One of ordinary skill in the art should recognize, based on the teachings herein, that numerous modifications and substitutions can be made without departing from the scope of the invention which is defined by the claims.

TABLE 1

Optical absorption and cyclic voltammetric results of the polymer films

| | $\lambda_{max}$ (nm) | $E_g^a$ (eV) | Eox (V) | HOMO (eV) | Voc (V) |
|---|---|---|---|---|---|
| Example 2 | 601 | 1.63 | 0 | −4.70 | 0.40 |
| Example 3 | 495 | 2.13 | 0.42 | −5.12 | 0.65 |
| Example 4 | 591 | 1.70 | 0.33 | −5.03 | 0.78 |
| Example 5 | 780 | 1.05 | −0.10 | −4.60 | 0.12 |
| Example 6 | 532 | 1.97 | −0.15 | −4.55 | 0.20 |
| Example 7 | 510 | 2.03 | 0.22 | −4.92 | 0.58 |
| Example 8 | 511 | 2.06 | 0.23 | −4.93 | 0.72 |
| Example 9 | 650 | 1.55 | 0.33 | −5.03 | 0.60 |
| Example 10 | 520 | 1.85 | 0.50 | −5.20 | 0.96 |

We claim:

1. A conjugated polymer comprising a repeated unit having the structure of formula (I)

(I)

wherein A1, A2, R1 and R2 are independently selected from the group consisting of a proton, an alkyl group comprising up to 18 carbon atoms, an alkoxy group comprising up to 18 carbon atoms, cyano, nitro, aryls and substituted aryls, and wherein Ar is selected from the group consisting of optionally substituted optionally substituted and bicyclic or polycyclic N-containing heteroarylene with one to five nitrogen atoms; and one to five such groups fused or linked, where the Ar group can have one or two substituents that are independently aryl, alkyl or alkoxy having from 1-18 carbon atoms, or two adjacent carbons on the Ar group may be substituted to together form an ethylene dioxy group, wherein when Ar is it is unsubstituted.

2. The conjugated polymer of claim 1, wherein the repeated units have the structure of formula (II)

(II)

wherein R1, R2 are independently selected from the group consisting of an alkyl group with 4-12 carbon atoms, an alkoxy group with 4-12 carbon atoms, aryls and substituted aryls; and wherein Ar is or a bicyclic or polycyclic N-containing heteroarylene with one to five nitrogen atoms, where the Ar group can have one or two substituents that are independently aryl, alkyl or alkoxy having from 1-18 carbon atoms, or two adjacent carbons on the Ar group may be substituted to together form an ethylene dioxy group.

3. The conjugated polymer of claim 2, wherein Ar is selected from the group consisting of and where the Ar group can have one or two substituents that are independently aryl, alkyl or alkoxy having from 1-18 carbon atoms, or two adjacent carbons on the Ar group may be substituted to together form an ethylene dioxy group.

4. The conjugated polymer of claim 2, wherein Ar is selected from bicyclic and polycyclic N-containing heteroarylene with one to five nitrogen atoms, where the Ar group can have one or two substituents that are independently aryl, alkyl or alkoxy having from 1-18 carbon atoms, or two adjacent carbons on the Ar group may be substituted to together form an ethylene dioxy group.

5. The conjugated polymer of claim 4, wherein Ar are selected from the units as shown below or the substituted units as shown below:

6. The conjugated polymer of claim 2 selected from the group consisting of:
Poly[4,8-d]dodecyloxy-benzo[1,2-b; 3,4-b]dithiophene-2,6-diyl]-Co-[2,3-d]phenylquinoxaline-5,8-diyl];
Poly[4,8-didodecyloxy-benzo[1,2-b; 3,4-b]dithiophene-2,6-diyl]-Co-[2,1,3-benzothiadiazole-4,7-diyl];
Poly[4,8-didodecyloxy-benzo[1,2-b; 3,4-b]dithiophene-2,6-diyl]-Co-[thieno[3,4-b]pyrazine-5,7-diyl]; and
Poly[4,8-didodecyloxy-benzo[1,2-b; 3,4-b]dithiophene-2,6-diyl]-Co-[benzo[c][1,2,5]selenadiazole-4,7-diyl].

7. The conjugated polymer of claim 2, wherein Ar is selected from the group consisting of:
2,3-diphenylquinoxaline-5,8-diyl;
2,1,3-benzothiadiazole-4,7-diyl;
thieno[3,4-b]pyrazine-5,7-diyl; and
benzo[c][1,2,5]selenadiazole-4,7-diyl.

8. The conjugated polymer of claim 2, wherein $R_1=R_2=$dodecyloxy.

9. An electronic or electro-optic device comprising a conjugated polymer material according to claim 1.

10. The device according to claim 9, wherein said conjugated polymer material is a photovoltaic material.

11. The device according to claim 10, wherein said electronic or electro-optic device is a polymer solar cell device or photodetector device.

12. The device according to claim 11, wherein said device is a polymer solar cell device comprising a bulk heterojunction structure.

13. The device according to claim 12, wherein said bulk heterojunction structure comprises at least one ingredient in addition to said conjugated polymer.

14. The device according to claim 13, wherein said at least one ingredient in addition to said conjugated polymer is at least one of a fullerene or its derivatives.

15. The device according to claim 14, wherein said fullerene or its derivatives is at least one of [6,6]-phenyl $C_{61}$ butyric acid methyl ester or [6,6]-phenyl $C_{71}$ butyric acid methyl ester.

16. An electronic or electro-optic device, comprising:
a first electrode;
a second electrode spaced apart from said first electrode; and
a layer of active material disposed between said first electrode and said second electrode,
wherein said active layer comprises a conjugated polymer comprising a repeated unit having the structure of formula (I)

(I)

wherein A1, A2, R1 and R2 are independently selected from the group consisting of a proton, an alkyl group comprising up to 18 carbon atoms, an alkoxy group comprising up to 18 carbon atoms, cyano, nitro, aryls and substituted aryls, and wherein Ar is selected from the group consisting of optionally substituted optionally substituted and a bicyclic or polycyclic N-containing heteroarylene with one to five nitrogen atoms;

and one to five such groups fused or linked, where the Ar group can have one or two substituents that are independently aryl, alkyl or alkoxy having from 1-18 carbon atoms, or two adjacent carbons on the Ar group may be substituted to together form an ethylene dioxy group, wherein when Ar is it is unsubstituted.

17. The conjugated polymer of claim 1, wherein Ar is selected from the group consisting of and one to five such groups one of fused or linked.

18. A conjugated polymer comprising a repeated unit having the structure of formula (II)

(II)

wherein R1, R2 are independently selected from the group consisting of an alkoxy group with 4-12 carbon atoms, and wherein Ar is selected from the group consisting of a monocyclic heteroarylene containing S, fused to an arylene or a heteroarylene;

a monocyclic heteroarylene containing from one to four nitrogen atoms, optionally containing one or two sulfur atoms, and optionally fused to one or more arylenes or heteroarylenes; and one to five such groups one of fused or linked, where the Ar group can have one or two substituents that are independently alkyl or alkoxy having from 1-18 carbon atoms, wherein when Ar is it is unsubstituted.

19. A conjugated polymer comprising a repeated unit having the structure of formula (II)

(II)

wherein R1, R2 are independently selected from the group consisting of an alkoxy group with 4-12 carbon atoms, and wherein Ar is selected from the group consisting of
- a monocyclic heteroarylene containing S, fused to an arylene or a heteroarylene;
- a monocyclic heteroarylene containing from one to four nitrogen atoms, optionally containing one or two sulfur atoms, and optionally fused to one or more arylenes or heteroarylenes, where the Ar group can have one or two substituents that are independently alkyl or alkoxy having from 1-18 carbon atoms, wherein when Ar is

, it is unsubstituted.

20. The conjugated polymer of claim 1, wherein Ar is unsubstituted.

* * * * *